United States Patent
Yasui et al.

(10) Patent No.: US 10,651,720 B2
(45) Date of Patent: May 12, 2020

(54) INTELLIGENT POWER MODULE

(71) Applicant: Mitsubishi Electric Corporation, Tokyo (JP)

(72) Inventors: Takatoshi Yasui, Tokyo (JP); Takahiko Murakami, Fukuoka (JP); Akira Yamamoto, Fukuoka (JP); Yoshikazu Tsunoda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/087,666

(22) PCT Filed: May 25, 2016

(86) PCT No.: PCT/JP2016/065443
§ 371 (c)(1),
(2) Date: Sep. 24, 2018

(87) PCT Pub. No.: WO2017/203624
PCT Pub. Date: Nov. 30, 2017

(65) Prior Publication Data
US 2019/0103802 A1    Apr. 4, 2019

(51) Int. Cl.
*H02M 1/084* (2006.01)
*H02M 3/28* (2006.01)
(Continued)

(52) U.S. Cl.
CPC ............ *H02M 1/084* (2013.01); *H02M 1/00* (2013.01); *H02M 3/28* (2013.01); *H02M 7/48* (2013.01); *H03K 5/00* (2013.01); *H03K 7/08* (2013.01)

(58) Field of Classification Search
CPC ............ H02M 1/00; H02M 3/28; H02M 7/48; H02M 1/084; H03K 5/00; H03K 7/08
See application file for complete search history.

(56) References Cited

U.S. PATENT DOCUMENTS

2008/0266042 A1    10/2008  Yoshimura et al.
2009/0251925 A1*   10/2009  Usui ................. H02M 3/33561
                                                363/16
(Continued)

FOREIGN PATENT DOCUMENTS

JP    H04-105556 A    4/1992
JP    2008-277485 A   11/2008
(Continued)

OTHER PUBLICATIONS

An Office Action mailed by the Japanese Patent Office dated Dec. 4, 2018, which corresponds to Japanese Patent Application No. 2018-518861 and is related to U.S. Appl. No. 16/087,666.
(Continued)

*Primary Examiner* — Adolf D Berhane
*Assistant Examiner* — Kevin H Sprenger
(74) *Attorney, Agent, or Firm* — Studebaker & Brackett PC

(57) ABSTRACT

An object of the present invention is to synchronize PWM between individual phases of an IPM, so that the IPM has a simplified-scale circuit. An IPM according to the present invention includes a DC-DC converter including a multi-phase arm having a plurality of phase arms connected in parallel on a secondary side, a secondary-wire-voltage detection circuit configured to detect a secondary wire voltage in each phase arm of the DC-DC converter, and a synchronization-signal generation circuit configured to generate a synchronization signal in each phase arm on the basis of the behavior of the secondary wire voltage.

7 Claims, 14 Drawing Sheets

(51) Int. Cl.
*H02M 7/48* (2007.01)
*H03K 5/00* (2006.01)
*H03K 7/08* (2006.01)
*H02M 1/00* (2006.01)

(56) References Cited

U.S. PATENT DOCUMENTS

2014/0070812 A1\* 3/2014 Yokoi .................... A61B 6/032
        378/4
2015/0016159 A1\* 1/2015 Deboy .................... H02J 3/383
        363/71
2016/0116925 A1\* 4/2016 Freeman ........... H02M 3/33546
        307/130
2016/0118974 A1 4/2016 Terasawa et al.
2018/0294720 A1\* 10/2018 Zhu ...................... H02M 3/158

FOREIGN PATENT DOCUMENTS

JP    2012-210012 A    10/2012
WO    2006/061924 A1   6/2006
WO    2015/076014 A1   5/2015

OTHER PUBLICATIONS

International Search Report issued in PCT/JP2016/065443; dated Aug. 9, 2016.

\* cited by examiner

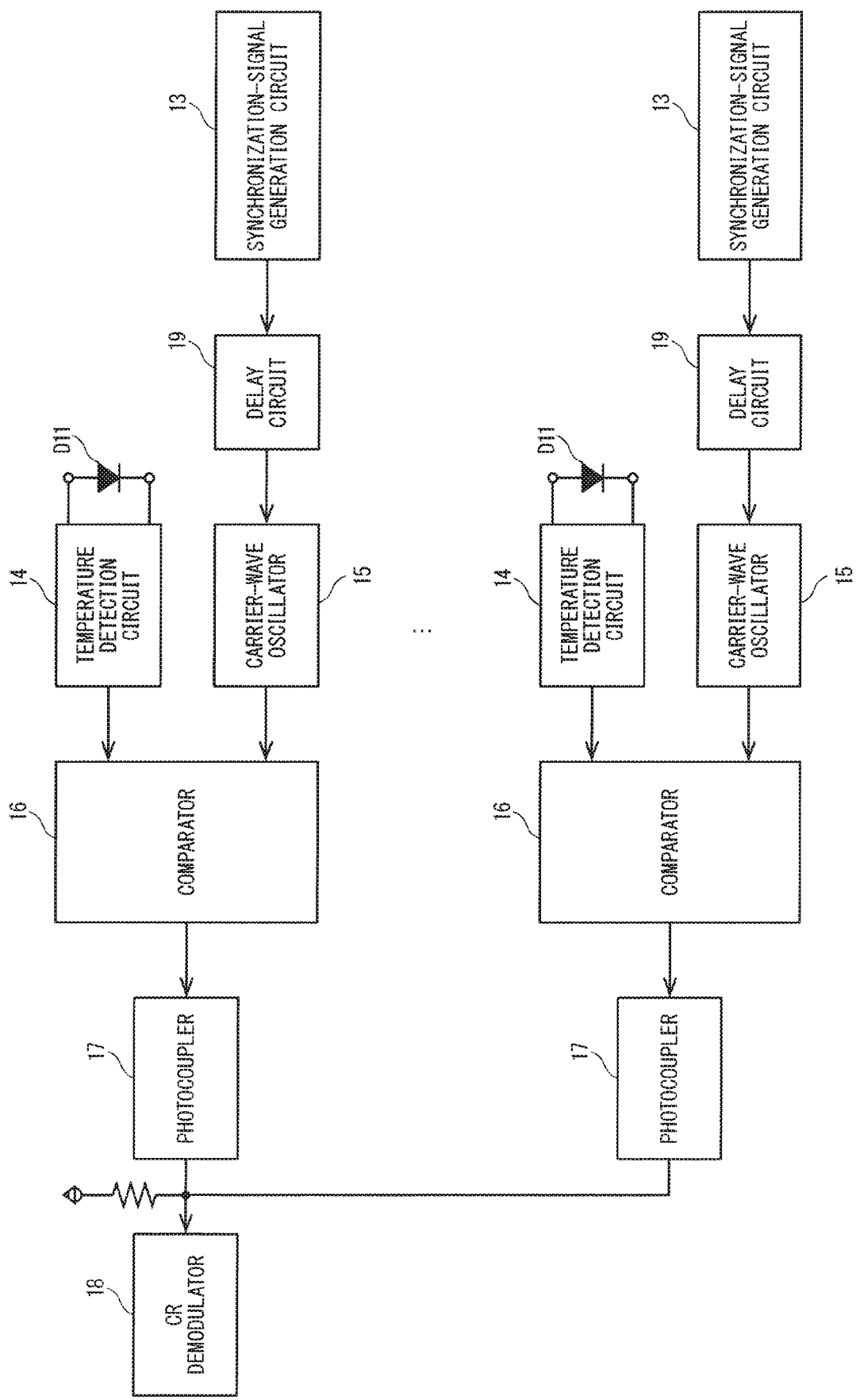
F I G. 15

INTELLIGENT POWER MODULE

TECHNICAL FIELD

This invention relates to intelligent power modules.

BACKGROUND ART

A conventional intelligent power module (IPM) sends detected signals in multiple phases on a secondary side, which is a high-voltage side, to a primary side, which is a low-voltage GND side, via a photocoupler, and selects the signals on the primary side, as appropriate.

Reference is made to temperature outputs of an IPM used for an inverter for instance. Chip temperatures of, for instance, an Insulated Gate Bipolar Transistor (IGBT) are converted into voltages as temperature signals. The temperature signals undergo Pulse Width Modulation (PWM) modulation, undergo insulation in the photocoupler, and are then transmitted from the secondary side to the primary side. The primary side demodulates the temperature signals through PWM, selects the temperature signal in one phase from among the temperature signals in all the phases, and outputs the selected temperature signal. Here, a temperature signal indicating the highest temperature among those in six phases needs to be selected in order to protect the IPM.

Patent Document 1 discloses a DC-DC converter that outputs a synchronization signal at the timing when a voltage at a secondary wire terminal rises to a secondary rectified voltage.

PRIOR ART DOCUMENT

Patent Document

Patent Document 1: International Publication No. 2006/061924

SUMMARY

Problem to be Solved by the Invention

Unfortunately, the conventional IPM, which has asynchronous PWM between the individual phases, requires an analog selection circuit for all the phases, thus involving a large-scale circuit and a complex configuration. The conventional IPM also requires modulation circuits for all the phases, thus involving a large-scale circuit and a complex configuration.

In view of this problem, it is an object of the present invention to synchronize PWM between individual phases of an IPM, so that the IPM has a simplified-scale circuit.

Means to Solve the Problem

An IPM according to the present invention includes the following: a DC-DC converter circuit including a multi-phase arm having a plurality of phase arms connected in parallel on a secondary side, a secondary-wire-voltage detection circuit configured to detect a secondary wire voltage in each phase arm of the DC-DC converter circuit, and a synchronization-signal generation circuit configured to generate a synchronization signal in each phase arm on the basis of the behavior of the secondary wire voltage.

Effects of the Invention

The IPM according to the present invention supplies the synchronization signal to each phase arm on the secondary side and to a primary side, thus synchronizing PWM between the individual phases. This achieves a simplified-scale circuit.

These and other objects, features, aspects and advantages of the present invention will become more apparent from the following detailed description of the present invention when taken in conjunction with the accompanying drawings.

BRIEF DESCRIPTION OF DRAWINGS

FIG. 15 is a diagram illustrating the configuration of an IPM according to a third embodiment.

DESCRIPTION OF EMBODIMENT(S)

A. First Embodiment

Figure 1:
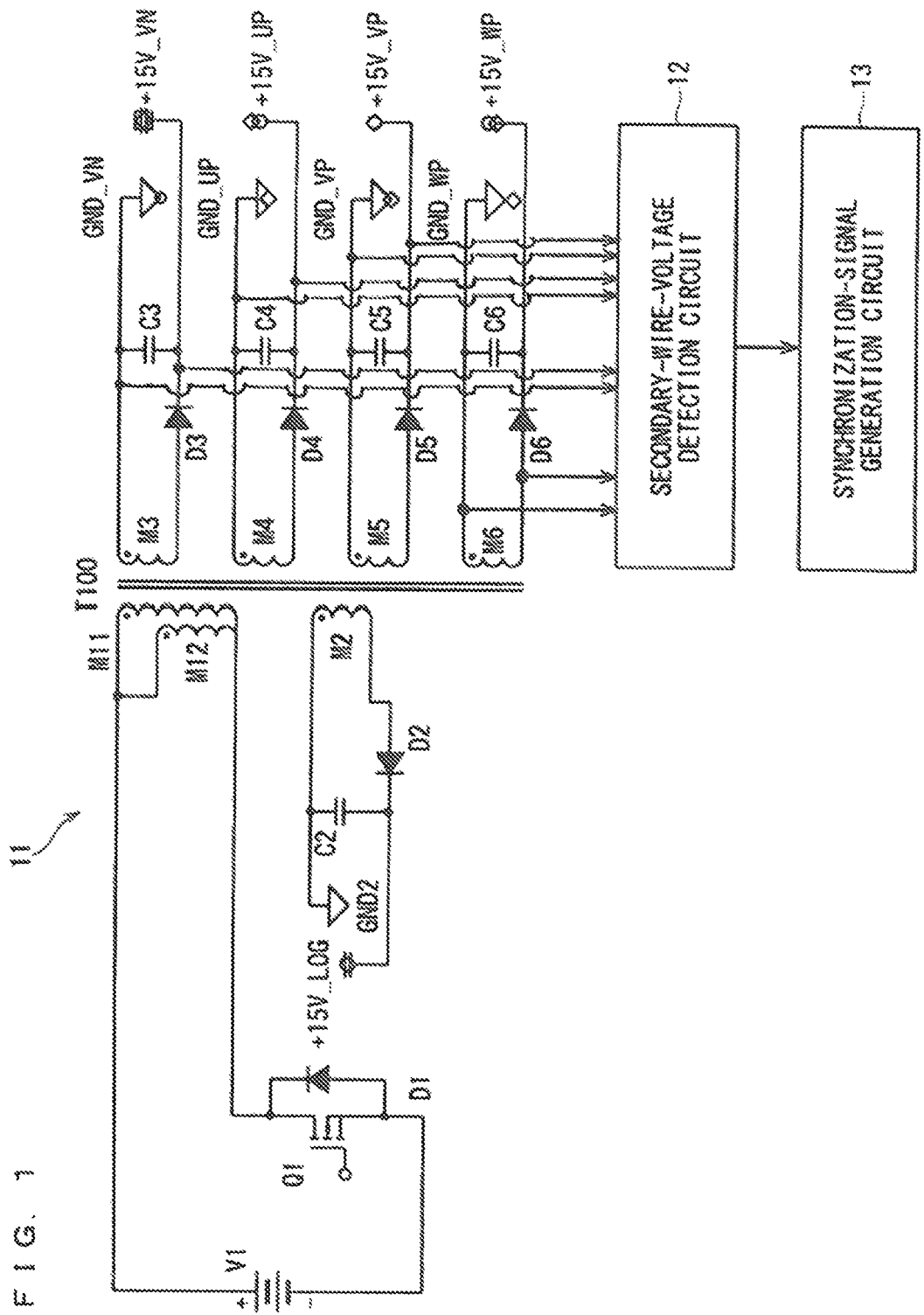
FIG. 1 is a diagram illustrating the configuration of an IPM according to a first embodiment.

FIG. 1 is a diagram illustrating the configuration of an IPM according to a first embodiment. The IPM according to the first embodiment includes a DC-DC converter 11, a secondary-wire-voltage detection circuit 12, and a synchronization-signal generation circuit 13.

The DC-DC converter 11 has a primary side including an n-MOSFET Q1, which is a switching element. Connected between the source and drain of the n-MOSFET Q1 is a diode D1. The drain of the n-MOSFET Q1 is connected to a parallel structure formed of primary coils M11 and M12 included in a transformer T100. A power supply V1 is connected between a source terminal of the n-MOSFET Q1, and ends of the primary coils M11 and M12 remote from the n-MOSFET Q1 is connected. The transformer T100 has a primary coil M2 forming a circuit different from the n-MOSFET Q1. The primary coil M2 has one end grounded to a ground GND2, and the other end connected to a diode D2 in series. The diode D2 has an end remote from the primary coil M2. This end is connected to a power supply 15V. The primary coil M2 and the diode D2 constitutes a serial structure connected to a capacitor C2 in parallel.

The DC-DC converter 11 has a secondary side provided with a multi-phase arm including a plurality of phase arms connected in parallel. Although including four phases in FIG. 1: a VN phase, a UP phase, a VP phase, and a WP phase, the multi-phase arm may include six phases: these four phases and additional UN and WN phases.

The transformer T100 has secondary coils M3, M4, M5, and M6 respectively corresponding to the VN phase, the UP phase, the VP phase, and the WP phase. In the VN phase, the secondary coil M3 has one end disposed on a ground GND, and the other end connected to a diode D3 in series. The diode D3 has an end remote from the primary coil M3. This end is connected to the power supply 15V. The secondary coil M3 and the diode D3 constitutes a serial structure connected to a capacitor C3 in parallel. The UP, VP, and WP phases have configurations similar to the configuration of the VN phase. The UP, VP, and WP phases include diodes D4, D5, and D6, instead of the diode D3 in the VN phase, and capacitors C4, C5, and C6, instead of the capacitor C3 in the VN phase.

The secondary-wire-voltage detection circuit 12 detects voltages across the secondary coils in the individual phases as secondary wire voltages. As illustrated in FIG. 1 for instance, the secondary-wire-voltage detection circuit 12 detects the voltage across the secondary coil M6 in the WP phase as the secondary wire voltage.

The synchronization-signal generation circuit 13 obtains the secondary wire voltages from the secondary-wire-voltage detection circuit 12, and generates synchronization signals in the individual arms on the basis of the behavior of the obtained voltages.

Figure 2:
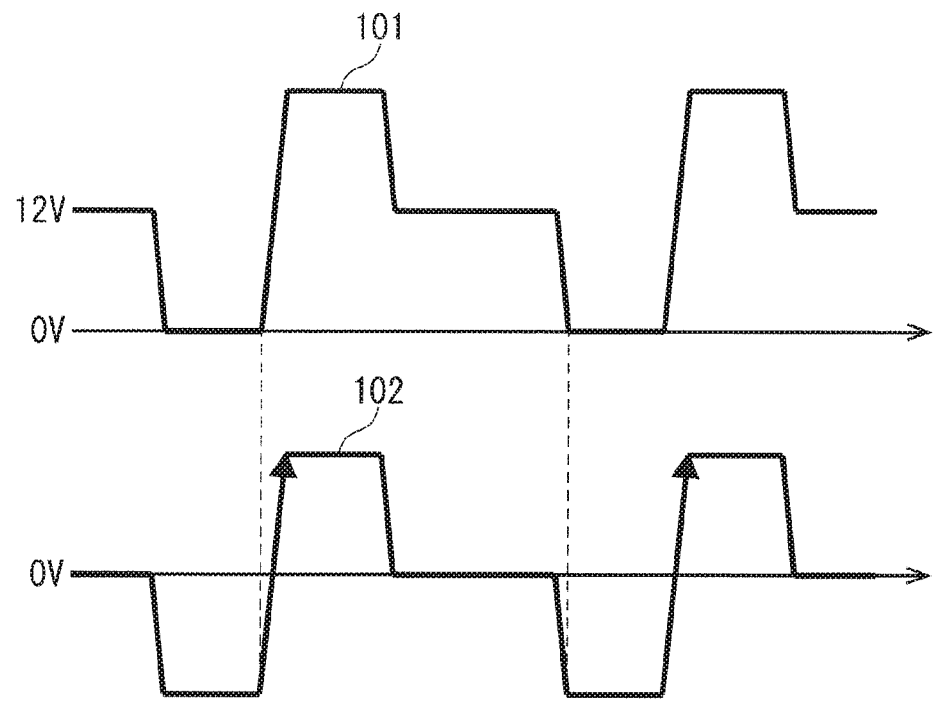
FIG. 2 is a diagram illustrating a first example of the timing at which a synchronization-signal generation circuit generates a synchronization signal.

FIG. 2 is a diagram illustrating a first example of the timing at which the synchronization-signal generation circuit 13 generates the synchronization signals. A secondary wire voltage 102 is obtained with respect to an input voltage 101 of the DC-DC converter 11 operating in discontinuous mode or continuous mode. The synchronization-signal generation circuit 13 outputs the synchronization signals at the timing, denoted by arrows in FIG. 2, at which the secondary wire voltage 102 rises to a rectified voltage. Generating the synchronization signals from the secondary wire voltages in the individual phases allows the synchronization signals to be supplied to all the phases on the secondary side. The secondary wire voltage 102 synchronizes with the input voltage 101; in addition, the behavior of the input voltage 101 is controlled through switching of the n-MOSFET Q1. This also allows the primary side to synchronize with the secondary side using the switching timing of the n-MOSFET Q1.

The synchronization-signal generation circuit 13 may output the synchronization signals at the timing when the secondary wire voltage 102 rises. The secondary wire voltage 102 at this stage may be lower or higher than the rectified voltage.

Figure 3:
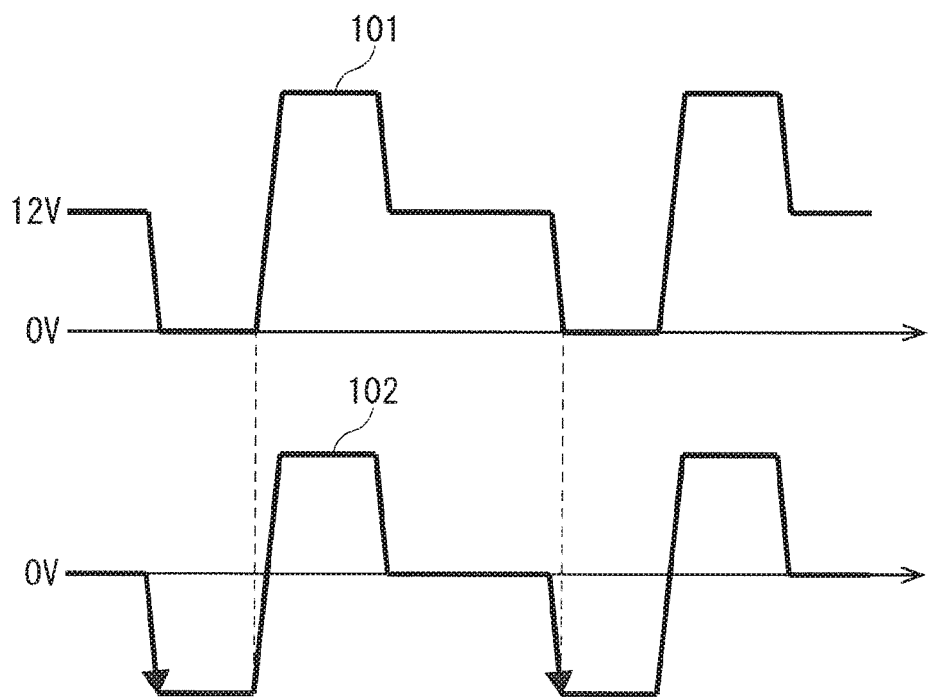
FIG. 3 is a diagram illustrating a second example of the timing at which the synchronization-signal generation circuit generates the synchronization signal.

FIG. 3 is a diagram illustrating a second example of the timing at which the synchronization-signal generation circuit 13 generates the synchronization signals. The secondary wire voltage 102 is obtained with respect to the input voltage 101 of the DC-DC converter 11 operating in discontinuous mode or continuous mode. The synchronization-signal generation circuit 13 outputs the synchronization signals at the timing, denoted by arrows in FIG. 3, at which the secondary wire voltage 102 reaches a minus voltage. Here, a detected voltage may be equal to or smaller than a value calculated from the coil ratio of the primary coil to the secondary coil and from the primary input voltage 101, that is, a value close to 0 V. A malfunction resulting from vibration at near 0 V is avoided at this time. The second example provides more noise margins in addition to the effects of the first example.

Figure 4:
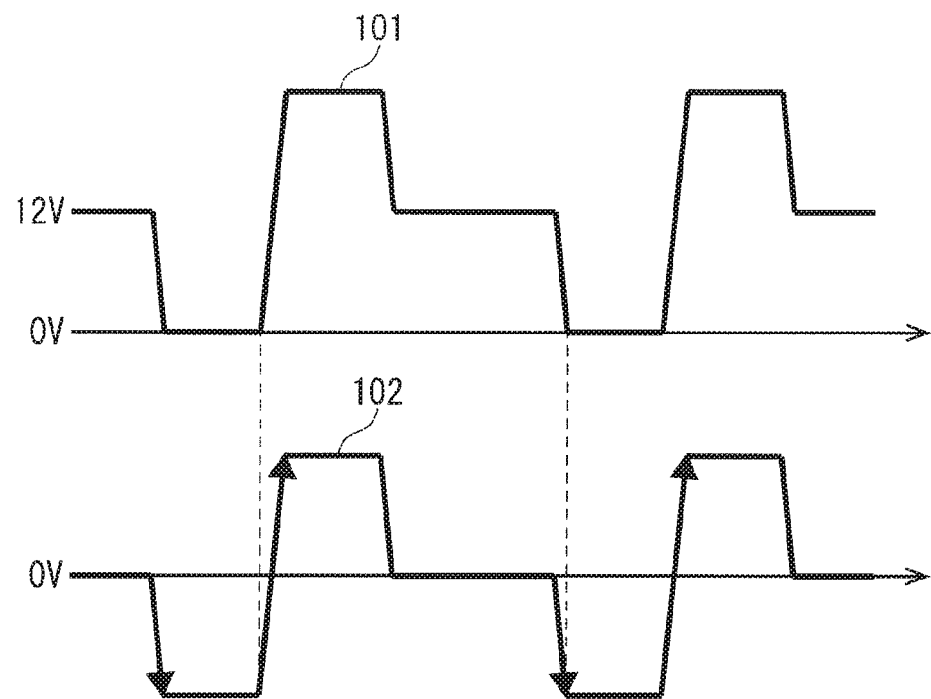
FIG. 4 is a diagram illustrating a third example of the timing at which the synchronization-signal generation circuit generates the synchronization signal.

FIG. 4 is a diagram illustrating a third example of the timing at which the synchronization-signal generation circuit 13 generates the synchronization signals. The third example is a combination of the first and second examples. The secondary wire voltage 102 is obtained with respect to the input voltage 101 of the DC-DC converter 11 operating in discontinuous mode or continuous mode. The synchronization-signal generation circuit 13 outputs the synchronization signals at the timing, denoted by arrows in FIG. 4, at which the secondary wire voltage 102 rises to a rectified voltage, and at which reaches a minus voltage. The third example provides the effects of the first and second examples, and also doubles the number of synchronization when compared to the first or second example. This allows the detected signal to be transmitted to the primary side at higher renewal frequency.

Figure 5:
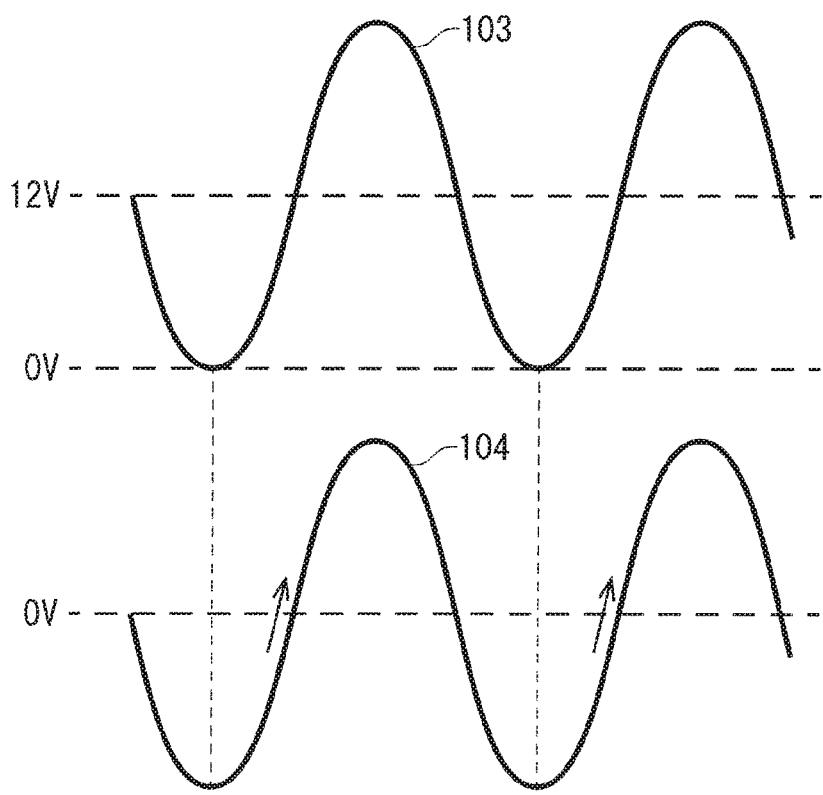
FIG. 5 is a diagram illustrating a fourth example of the timing at which the synchronization-signal generation circuit generates the synchronization signal.

FIG. 5 is a diagram illustrating a fourth example of the timing at which the synchronization-signal generation circuit 13 generates the synchronization signals. In the examples in FIGS. 2, 3, and 4, the DC-DC converter 11 operates in discontinuous mode or continuous mode. In the fourth example, the DC-DC converter 11 operates in resonant operation mode. A secondary wire voltage 104 is obtained with respect to an input voltage 103 of the DC-DC converter 11 operating in resonant operation mode. The synchronization-signal generation circuit 13 outputs synchronization signals on the basis of changes in the secondary wire voltage 104 in a positive direction, that is, positive changes in the secondary wire voltage 104. To be specific, the synchronization-signal generation circuit 13 outputs the synchronization signal at the timing when a change rate dV/dt of the secondary wire voltage 104 reaches 80% or more of a maximum value. Although the change rate is 80% or more of the maximum value, a higher value achieves more precise synchronization signals. The fourth example provides an effect similar to that in the first example. That is, the fourth example allows the synchronization signals to be supplied to all the phases on the secondary side, and further allows the primary side to synchronize with the secondary side using the switching timing of the n-MOSFET Q1.

Figure 6:
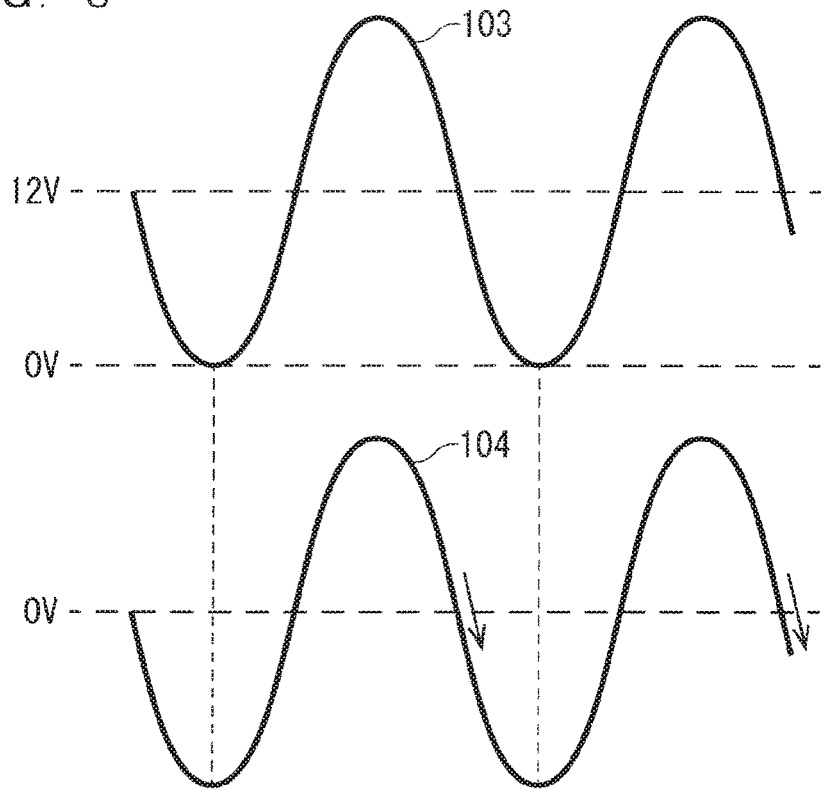
FIG. 6 is a diagram illustrating a fifth example of the timing at which the synchronization-signal generation circuit generates the synchronization signal.

FIG. 6 is a diagram illustrating a fifth example of the timing at which the synchronization-signal generation circuit 13 generates the synchronization signals. The secondary wire voltage 104 is obtained with respect to the input voltage 103 of the DC-DC converter 11 operating in resonant operation mode. The synchronization-signal generation circuit 13 outputs the synchronization signals on the basis of changes in the secondary wire voltage 104 in a negative direction, that is, negative changes in the secondary wire voltage 104. To be specific, the synchronization-signal generation circuit 13 outputs the synchronization signals at the timing when the change rate dV/dt of the secondary wire voltage 104 is a negative value and when an absolute value of the negative value reaches 80% or more of an absolute value of a minimum value of the change rate dV/dt. Changing the condition from 80% to a further higher value such as 85% or 90%, achieves a further more precise synchronization signals.

Figure 7:
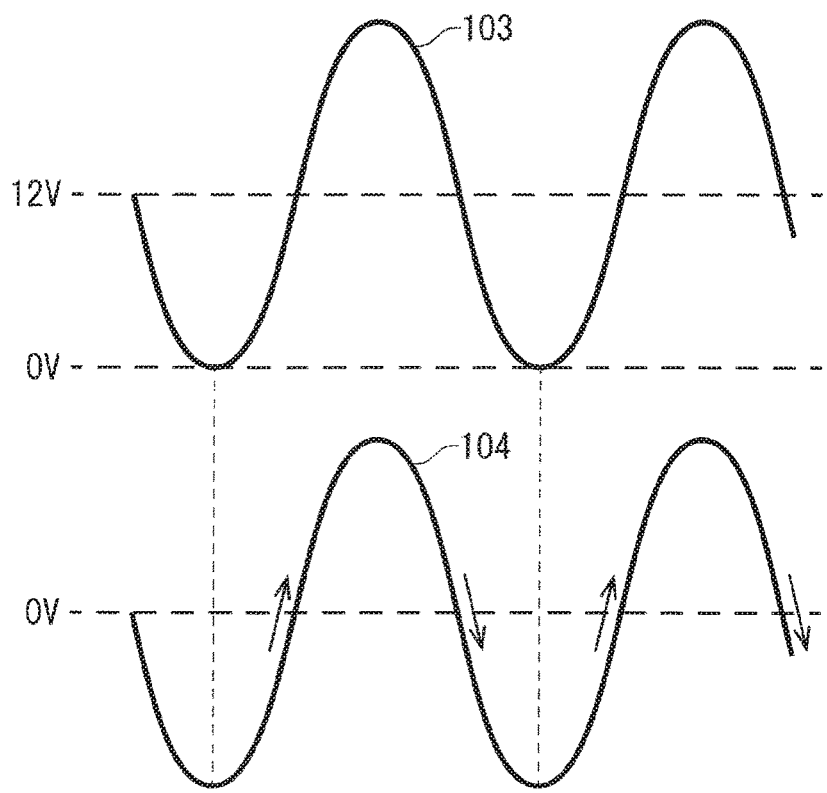
FIG. 7 is a diagram illustrating a sixth example of the timing at which the synchronization-signal generation circuit generates the synchronization signal.

FIG. 7 is a diagram illustrating a sixth example of the timing at which the synchronization-signal generation circuit 13 generates the synchronization signals. The sixth example is a combination of the fourth and fifth examples. The secondary wire voltage 104 is obtained with respect to the input voltage 103 of the DC-DC converter 11 operating in resonant operation mode. The synchronization-signal generation circuit 13 outputs the synchronization signals on the basis of both positive changes and negative changes in the secondary wire voltage 104. To be specific, the synchronization-signal generation circuit 13 outputs the synchronization signals at the timing when the change rate dV/dt of the secondary wire voltage 104 reaches 80% or more of a maximum value, and at the timing when an absolute value of a negative value reaches 80% or more of an absolute value of a minimum value. The sixth example provides the effects of the fourth and fifth examples, and also doubles the number of synchronization when compared to the fourth or fifth example. This allows the detected signal to be transmitted to the primary side at higher renewal frequency.

As described above, the IPM according to the first embodiment includes the following: the DC-DC converter 11 including the multi-phase arm having the plurality of phase arms connected in parallel on the secondary side, the secondary-wire-voltage detection circuit 12 detecting the secondary wire voltage in each phase arm of the DC-DC converter 11, and the synchronization-signal generation circuit 13 generating the synchronization signal in each phase arm on the basis of the behavior of the secondary wire voltage. This allows the synchronization signals to be supplied to all the phases on the secondary side. Further, using the switching timing of the switching element on the primary side allows the primary side to synchronize with the secondary side.

B. Second Embodiment

Figure 8:
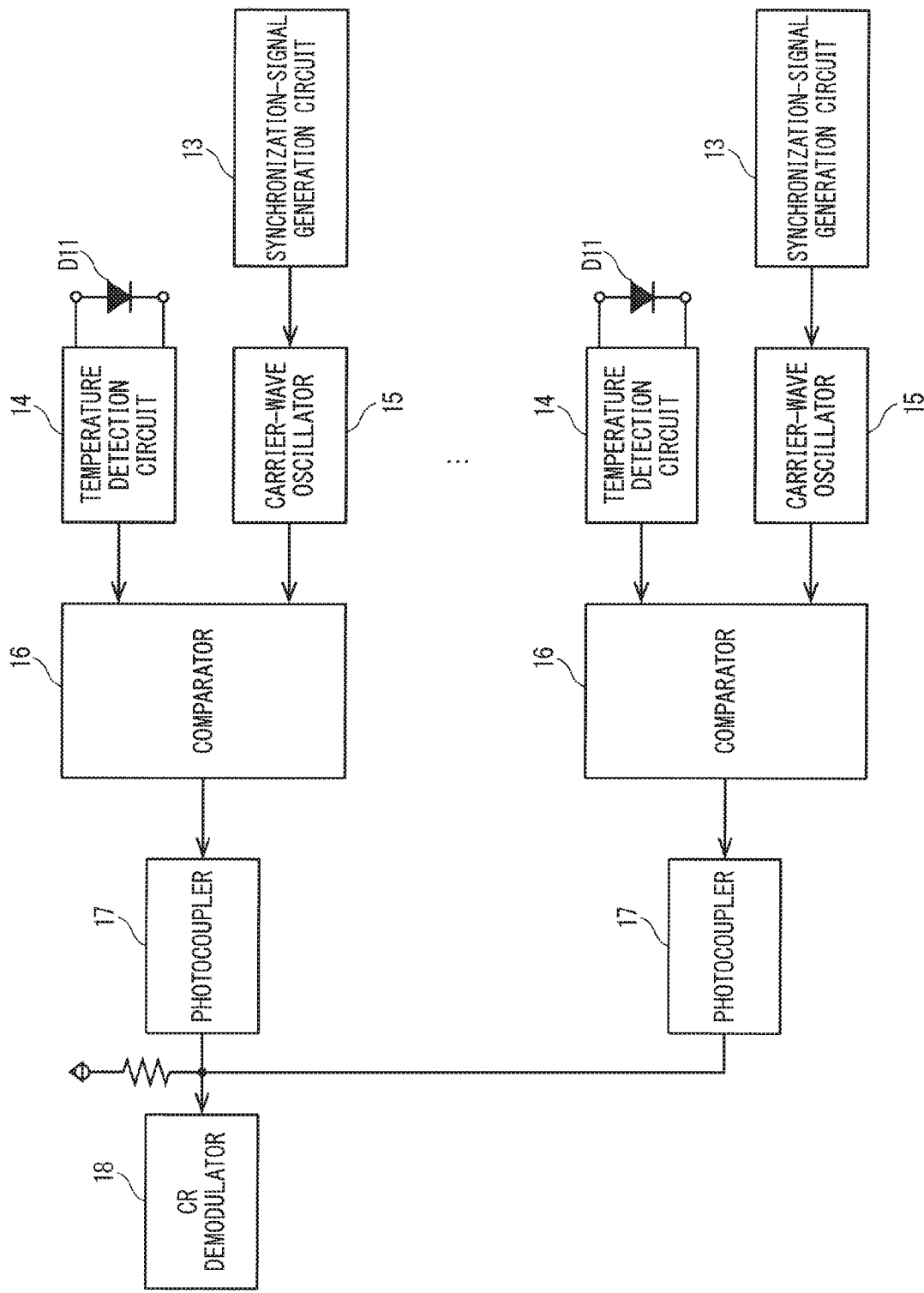
FIG. 8 is a diagram illustrating the configuration of an IPM according to a second embodiment.

FIG. 8 is a diagram illustrating the configuration of an IPM according to a second embodiment. The IPM according to the second embodiment includes, in addition to the components of the IPM according to the first embodiment, temperature detection circuits 14, carrier-wave oscillators 15, comparators 16, photocouplers 17, and CR demodulators 18.

It is noted that FIG. 8 does not show the DC-DC converter 11 and the secondary-wire voltage detection circuit 12. It is also noted that although FIG. 8 shows two sets of the synchronization-signal generation circuit 13, the carrier-wave oscillator 15, the temperature detection circuit 14, the comparator 16, and the photocoupler 17, these sets are practically provided for each phase of the DC-DC converter 11.

The temperature detection circuit 14 includes a temperature sensing diode D11. The temperature detection circuit 14 measures a chip temperature in each phase of the DC-DC converter 11 using the temperature sensing diode D11, converts a measurement result into a voltage value, and outputs the voltage value to the comparator 16 as temperature data.

The carrier-wave oscillator 15 obtains a synchronization signal from the synchronization-signal generation circuit 13, and oscillates a PWM carrier wave that is synchronous with the synchronization signal.

The comparator 16 compares the temperature date obtained from the temperature detection circuit 14 with the PWM carrier wave obtained from the carrier-wave oscillator 15, and performs PWM modulation. That is, the carrier-wave oscillator 15 and the comparator 16 operate as a PWM modulation circuit modulating the temperature data through PWM.

Figure 9:
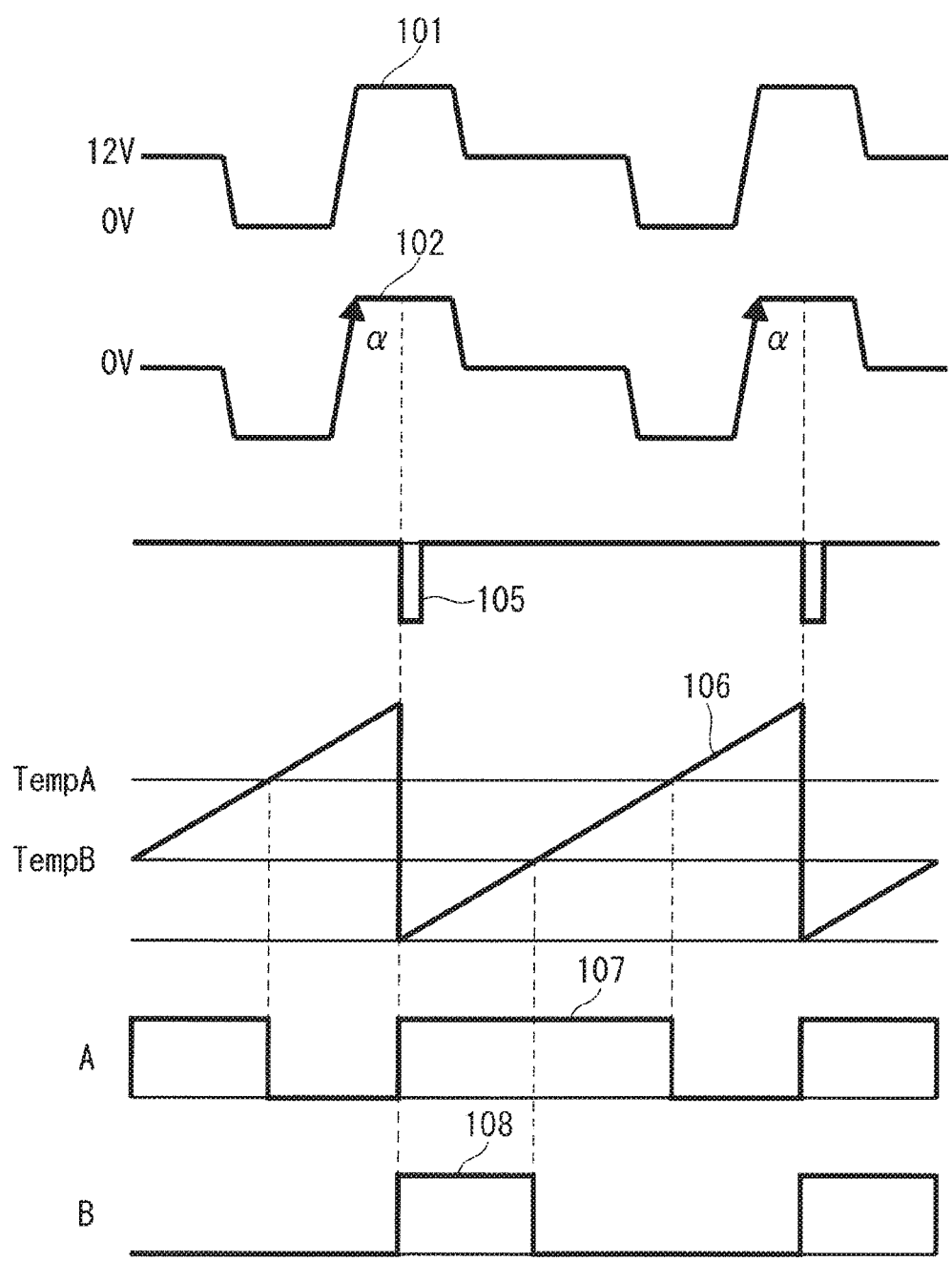
FIG. 9 is a diagram showing a relationship between a synchronization signal, a PWM carrier wave, and temperature data.

FIG. 9 is a diagram showing a relationship between the synchronization signal, the PWM carrier wave, and the temperature data. In the example in. FIG. 9, the synchronization-signal generation circuit 13 generates a synchronization signal 105 after a lapse of a time α from the rise of the secondary wire voltage 102 of the DC-DC converter 11. In addition, the carrier-wave oscillator 15 oscillates a sawtooth wave 106 as a PWM carrier wave. A waveform start time of the sawtooth wave 106 coincides with a pulse generation time of the synchronization signal 105.

In FIG. 9, TempA indicates temperature data in an A phase of the DC-DC converter 11; and TempB, temperature data in a B phase of the same. For simple description, FIG. 9 shows only two phases. The comparator 16 compares the sawtooth wave 106 with TempA, and outputs a pulse waveform consisting of 1, time periods when TempA>the sawtooth wave 106 is satisfied, and 0, the other time periods. This pulse waveform is A-phase temperature data 107 that has undergone PWM modulation. Likewise, the comparator 16 compares the sawtooth wave 106 with TempB, and outputs a pulse waveform consisting of 1, time periods when TempB>the sawtooth wave 106 is satisfied, and 0, the other time periods. This pulse waveform is B-phase temperature data 108 that has undergone PWM modulation. As seen from FIG. 9, a higher temperature provides a wider pulse width in PWM modulation. FIG. 9 illustrates an example of the synchronization signal generated on the basis of the timing at which the secondary wire voltage 102 rises. A similar relationship is established when the synchronization signal is generated on the basis of the timing at which the secondary wire voltage 102 drops, as illustrated in FIG. 3.

The temperature data that has undergone PWM modulation is transmitted to the primary side of the IPM via the photocoupler 17. Open collector outputs from the plurality of photocouplers 17 are integrated through wired OR connection, and undergo PWM demodulation in the CR the demodulator 18.

Figure 10:
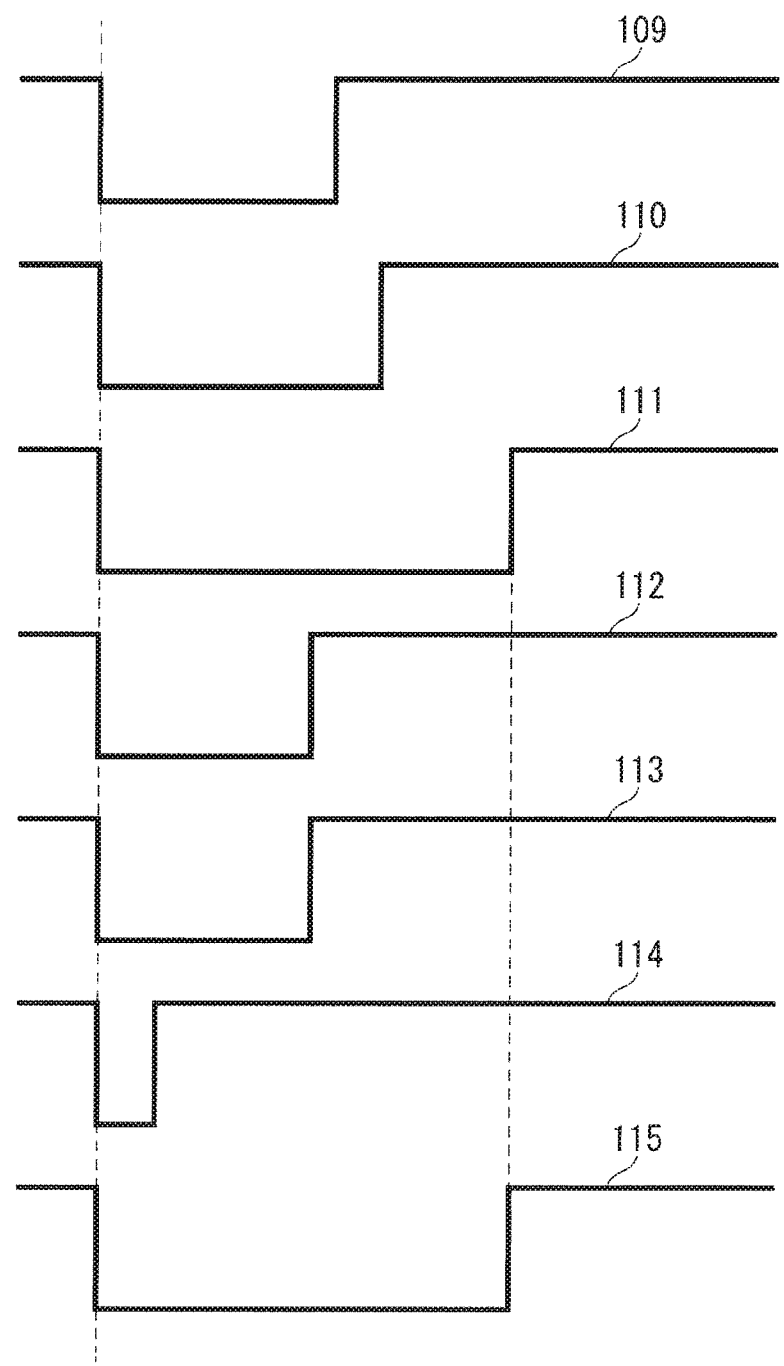
FIG. 10 is a diagram illustrating open collector outputs of pieces of temperature data in six phases that have undergone PWM modulation, and illustrating extracted waveforms through wired OR connection.

FIG. 10 illustrates open collector outputs 109 to 114 of pieces of temperature data that have undergone PWM modulation, in six phases of the DC-DC converter 11, and illustrates a waveform 115 formed by these open collector outputs and extracted through wired OR connection. Pull-up resistors reverse ON and OFF of open collector outputs. Hence, temperature data of a higher temperature provides a longer time period of 0. The waveform 115 extracted through wired OR connection is a waveform without ORs of the open collector outputs 109 to 114, and equal to the open collector output 111 of the temperature data of the highest temperature. In other words, the temperature data of the highest temperature in all the phases of the DC-DC converter 11 is extracted through wired OR connection.

Although the embodiment takes the temperature data as an example, other detected signals, such as a voltage signal and a current signal, can achieve a similar effect. For the voltage signal, converting a voltage magnitude into a pulse width for modulation through PWM allows a highest-voltage signal in all the phases of the DC-DC converter 11 to be extracted.

Figure 11:
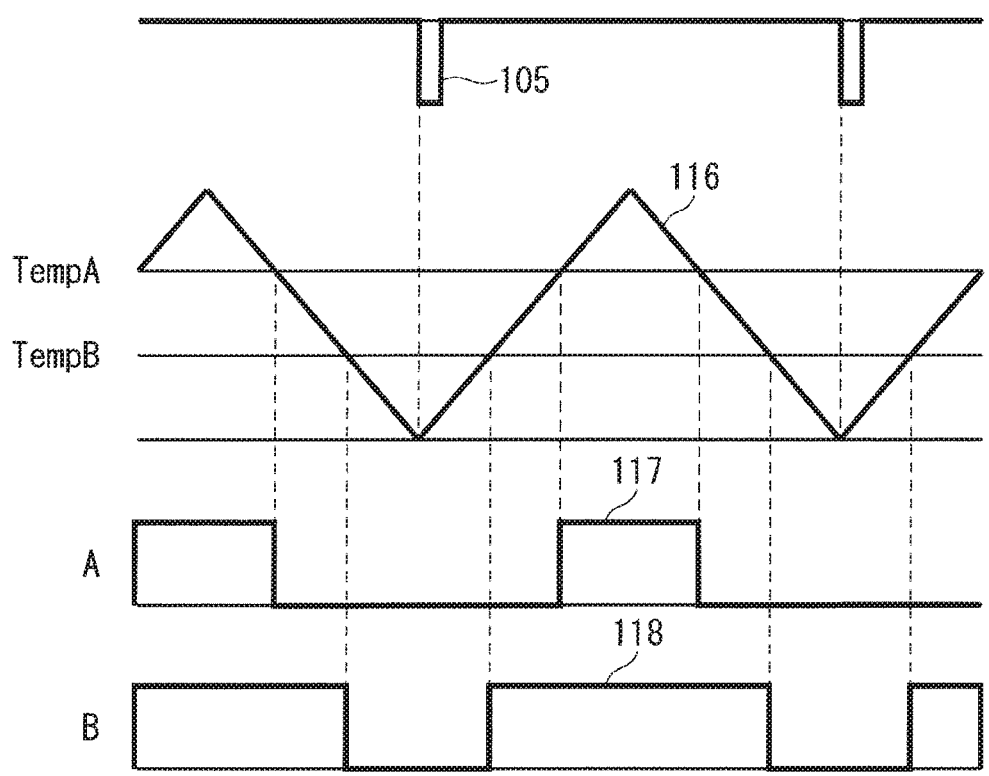
FIG. 11 is a diagram showing a relationship between the synchronization signal, the PWM carrier wave, and the temperature data.

The PWM carrier wave, although being a sawtooth wave in FIG. 9, may be a triangular wave. FIG. 11 is a diagram illustrating a relationship between the synchronization signal, the PWM carrier wave, and the temperature data when the PWM carrier wave is a triangular wave. FIG. 11 illustrates A-phase temperature data 117 that has undergone PWM modulation, and B-phase temperature data 118 that has undergone PWM modulation. As illustrated in FIG. 11, PWM modulation forms pulses having symmetrical widths with respect to the vertex of the triangular wave 116. Their pulse widths are specified by voltage values of the temperature data. Temperature data of a higher temperature provides a wider pulse width. As such, the triangular wave allows temperature data of the highest temperature in all the phases of the DC-DC converter 11 to be extracted through wired OR connection, like the sawtooth wave serving as a PWM carrier wave.

Figure 12:
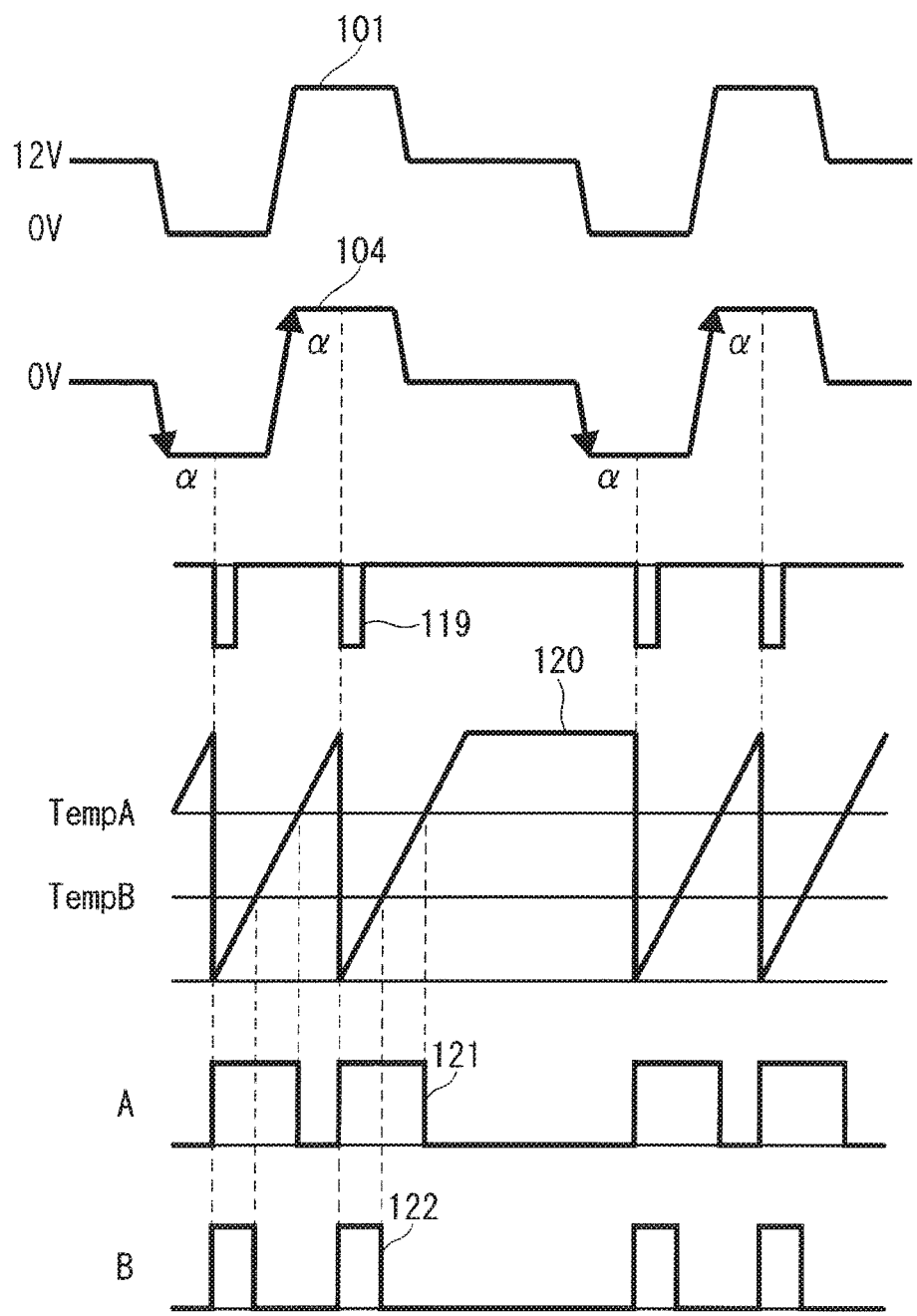
FIG. 12 is a diagram showing a relationship between the synchronization signal, the PWM carrier wave, and the temperature data.

FIG. 12 is a diagram showing a relationship between the synchronization signal, the PWM carrier wave, and the temperature data when the synchronization signal is generated using the method illustrated in FIG. 4. As illustrated in FIG. 12, the synchronization-signal generation circuit 13 generates a synchronization signal 119 after a lapse of the time α from the timing at which the secondary wire voltage 102 rises to a rectified voltage, and further after a lapse of the time α from the timing at which the secondary wire voltage 102 drops to a minus voltage. The carrier-wave oscillator 15 oscillates a sawtooth wave 120 as a PWM carrier wave. A waveform start time of the sawtooth wave 120 coincides with a pulse generation time of the synchronization signal 119. The comparator 16 compares the sawtooth wave 120 with TempA, which is the temperature data in the A phase, and obtains a pulse waveform consisting of 1, time periods when TempA>the sawtooth wave 120 is satisfied, and 0, the other time periods. This pulse waveform is a PWM modulation wave 121 of the temperature data in the A phase. Likewise, the comparator 16 compares the sawtooth wave 120 with TempB, and outputs a pulse waveform consisting of 1, time periods when TempB>the sawtooth wave 120 is satisfied, and 0, the other time periods. This pulse waveform is a PWM modulation wave 122 of the temperature data in the B phase.

Figure 13:
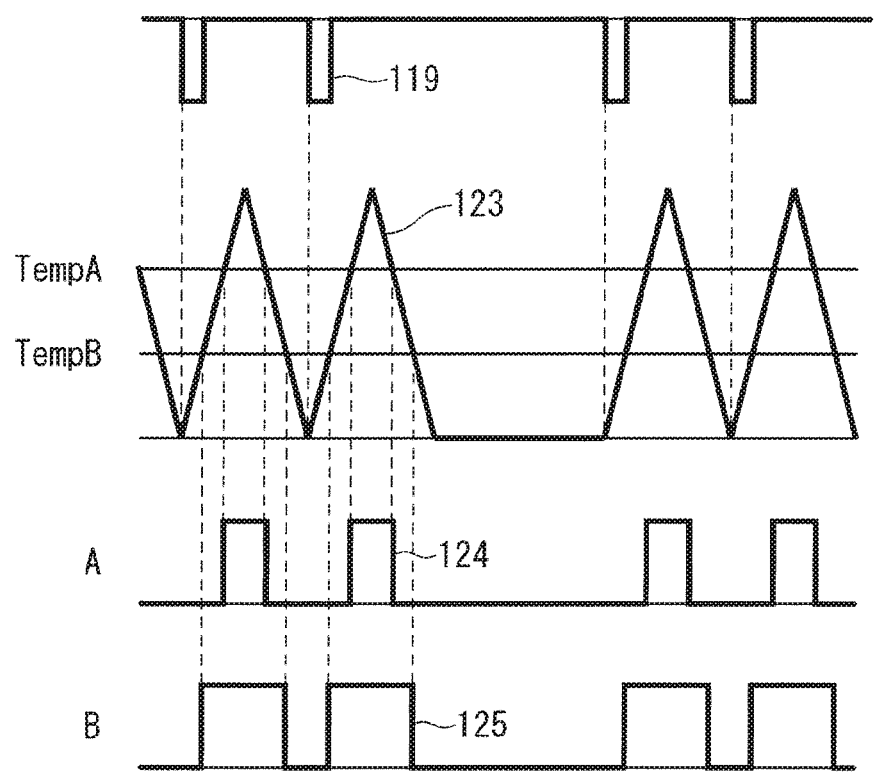
FIG. 13 is a diagram showing a relationship between the synchronization signal, the PWM carrier wave, and the temperature data.

The sawtooth wave in FIG. 12 is a PWM carrier wave. A triangular wave with respect to the synchronization signal 119 in FIG. 12 can be a PWM carrier wave. FIG. 13 shows a relationship between the synchronization signal, the PWM carrier wave, and the temperature data. As illustrated in FIG. 13, a triangular wave 123 is compared with TempA, which is the temperature data in the A phase, and TempB, which is the temperature data in the B phase; moreover, obtained are a PWM modulation wave 124 of the temperature data in the A phase, and a PWM modulation wave 125 of the temperature data in the B phase.

Figure 14:
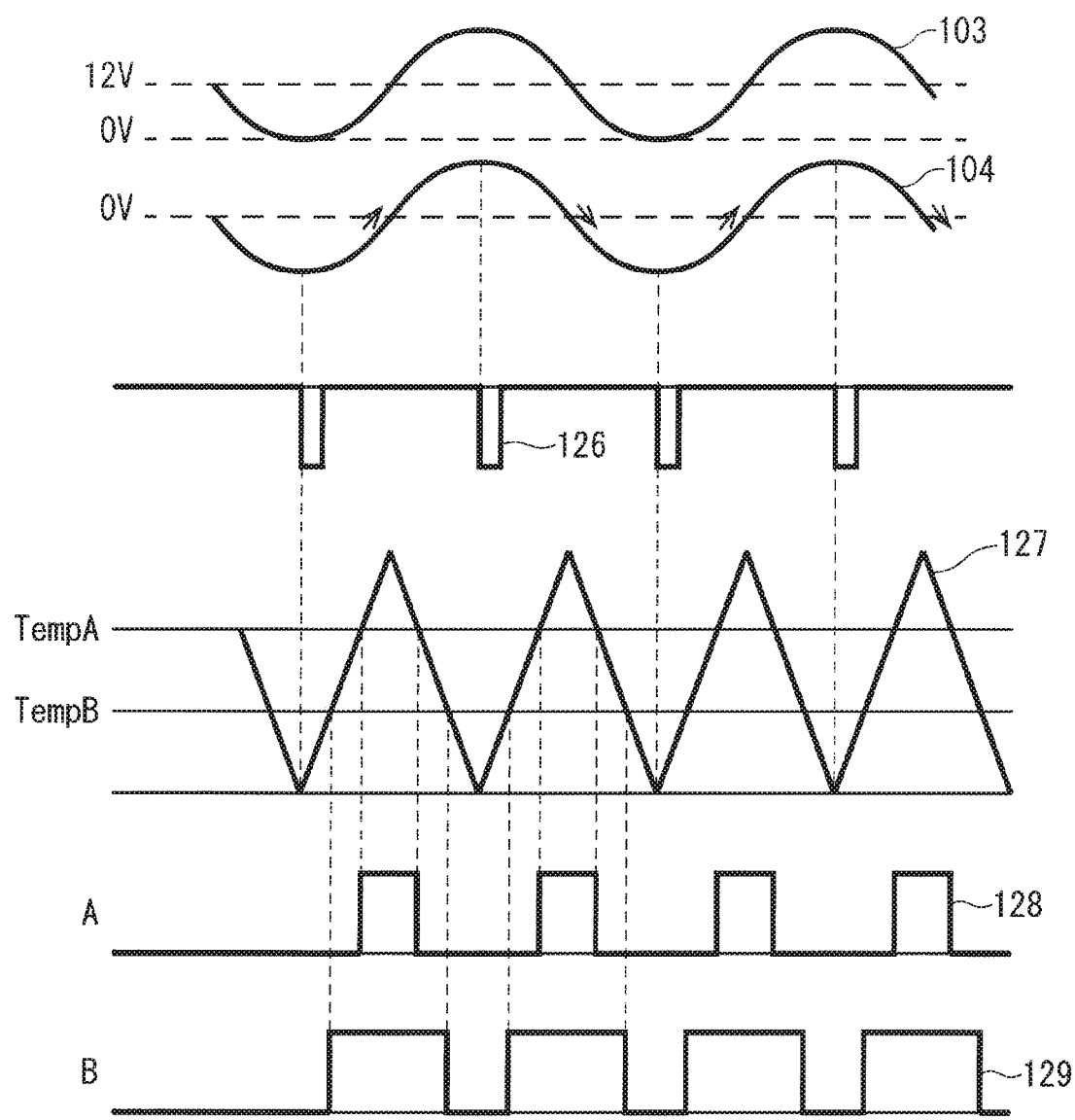
FIG. 14 is a diagram showing a relationship between the synchronization signal, the PWM carrier wave, and the temperature data.

FIG. 14 is a diagram showing a relationship between the synchronization signal, the PWM carrier wave, and the temperature data when the synchronization signal is generated using the method illustrated in FIG. 7. As illustrated in FIG. 14, the synchronization-signal generation circuit 13 generates a synchronization signal 126 after a lapse of the time α from the timing at which the change rate dV/dt of the secondary wire voltage 104 reaches 80% or more of a maximum value, and after a lapse of the time α from the timing at which an absolute value of a negative value reaches 80% or more of an absolute value of a minimum value of the change rate dV/dt. The carrier-wave oscillator 15 oscillates a triangular wave 127 as a PWM carrier wave. A rise start time of the triangular wave 127 coincides with a pulse generation time of the synchronization signal 119. The comparator 16 compares the triangular wave 127 with TempA and TempB, performs PMW modulation, and obtains a PWM modulation wave 128 of the temperature data in the A phase and a PWM modulation wave 129 of the temperature data in the B phase.

As clearly seen from FIG. 9 and FIGS. 11 to 14, the pulse widths of the PWM modulation waves are each specified by a tilt of the PWM carrier wave and a value of the temperature data. For instance, a small tilt of the PWM carrier wave provides a large ratio of change in the pulse width to temperature change. This enables temperature detection with high precision. Moreover, adding a negative offset to a voltage value of the temperature data produces a relatively large difference in voltage values of the temperature data between the phases. This enables temperature detection with high precision. Accordingly, the carrier-wave oscillator 15 may reduce the tilt of the PWM carrier wave when the temperature detection in each phase requires high precision. In addition, the comparator 16 may add a negative offset to the voltage value of the temperature data. Alternatively, only one of the reduction and the addition may be performed.

As describes above, the IPM according to the second embodiment includes the following: the temperature detection circuit 14 detecting the temperature in the phase arm, and obtaining the temperature as the temperature data; the PWM modulation circuit formed of the carrier-wave oscillator 15 and the comparator 16; the PWM modulation circuit modulating the temperature data through PWM; and the photocoupler 17 transmitting the temperature data that has undergone PWM modulation to the primary side of the DC-DC converter circuit. The PWM modulation circuit performs PWM modulation using the PWM carrier wave that is synchronous with the synchronization signal generated by the synchronization-signal generation circuit 13. As such, synchronizing the PWM carrier wave in each phase with the synchronization signal enables the start timing of the PWM modulation waveform to be synchronized between the individual phases. Moreover, the stop timing of the PWM modulation waveform is specified by a voltage value of the temperature data. Hence, connecting the PWM modulation waveforms in the individual phases through wired OR connection facilitates the selection of a high-temperature signal.

C. Third Embodiment

FIG. 15 is a diagram illustrating the configuration of an IPM according to a third embodiment. The IPM according to the third embodiment includes delay circuits 19 delaying the synchronization signal 119 for each phase of the DC-DC converter 11, in addition to the components of the IPM according to the second embodiment, illustrated in FIG. 8. The other components of the IPM according to the third embodiment are the same as those of the IMP according to the second embodiment.

It is noted that FIG. 15 does not show the DC-DC converter 11 and the secondary-wire-voltage detection circuit 12. It is also noted that although FIG. 15 shows two sets of the synchronization-signal generation circuit 13, the delay circuit 19, the carrier-wave oscillator 15, the temperature detection circuit 14, the comparator 16, and the photocoupler 17, these sets are practically provided for each phase of the DC-DC converter 11.

Figure 16:
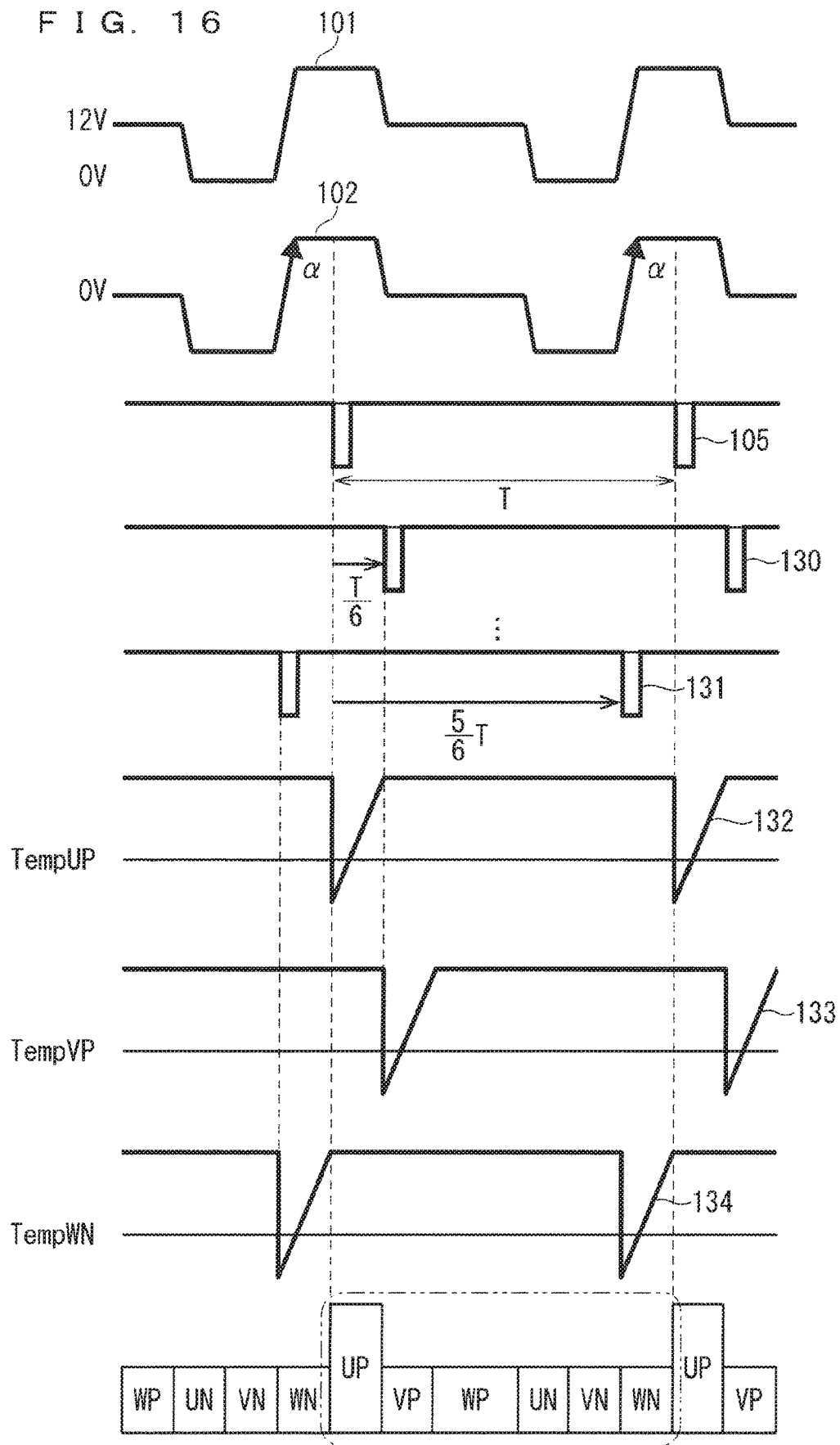
FIG. 16 is a diagram illustrating the operation of the IPM according to the third embodiment.

FIG. 16 is a diagram illustrating the operation of the IPM according to the third embodiment. As illustrated in FIG. 16, the secondary wire voltage 102 is obtained with respect to the input voltage 101 of the DC-DC converter 11 operating in discontinuous mode or continuous mode. The synchronization-signal generation circuit 13 generates the synchronization signal 105 after a lapse of a time α from the rise of the secondary wire voltage 102 of the DC-DC converter 11. The delay circuit 19 divides one cycle by the number of phases of the DC-DC converter 11, and sequentially delays a synchronization signal by the number of division.

The DC-DC converter 11 can have six phases on its secondary side: a UP phase, a VP phase, a WP phase, a UN phase, a VN phase, and a WN phase. Let one cycle of the synchronization signal 105 be T. Then, the delay circuit 19 divides this one cycle into six sections, and delays, by T/6, a synchronization signal 130 in the VP phase from the synchronization signal 105 in the UP phase with reference to the UP phase. Likewise, the delay circuit 19 delays synchronization signals in the phases from the synchronization signal 105 in the UP phase by the following numbers: for the synchronization signal in the WP phase, by 2T/6; for the synchronization signal in the UN phase, by 3T/6; for the synchronization signal in the VN phase, by 4T/6; and for the synchronization signal, 131, in the WN phase, by 5T/6.

The carrier-wave oscillator 15 oscillates a carrier wave in synchronization with the synchronization signal that has been delayed in the delay circuit 19. In the UP phase, the delay circuit 19 performs no delay process; accordingly, the carrier-wave oscillator 15 oscillates a sawtooth wave 132 in synchronization with the synchronization signal 105 without delays. In the VP phase, the carrier-wave oscillator 15 oscillates a sawtooth wave 133 in synchronization with the synchronization signal 130 with a T/6 delay. In the WN phase, the carrier-wave oscillator 15 oscillates a sawtooth wave 134 in synchronization with the synchronization signal 131 with a 5T/6 delay. In other words, the carrier-wave oscillator 15 shifts the start timing of a PWM carrier wave for each phase.

In the UP phase, the comparator 16 compares, for PWM modulation, TempUP that is chip temperature data in the UP phase obtained from the temperature detection circuit 14, with the sawtooth wave 132. Likewise, the comparator 16 modulates chip temperature data in each phase through PWM.

Figure 17:
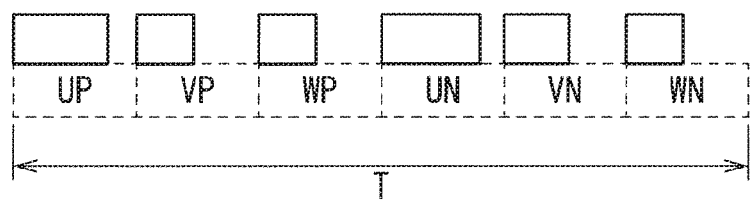
FIG. 17 is a diagram showing integrated temperature data.

That is, in the third embodiment, the cycle T of the synchronization signal 105 is divided into six sections; and the respective divided sections are allocated to the UP phase, the VP phase, the WP phase, the UN phase, the VN phase, and the WN phase. The PWM modulation waveforms of the temperature data in the individual phases are transmitted to a primary side of the IPM via the photocoupler 17, and further integrated through wired or connection, or logic connection. FIG. 17 illustrates the PWM modulation waveforms of the temperature data that have been now integrated, in one cycle denoted by a two-dot chain line in FIG. 16. FIG. 17 illustrates one cycle divided into six sections each having the PWM modulation waveform of the temperature data in the corresponding phase. As described above, in the third embodiment, sending the temperature data in each phase at regular intervals from the reset timing of the synchronization signal 105 enables the temperature data in all the phases to be multiplexed.

Herein, the temperature data is one example of a detected signal in the IPM. Other detected signals, such as a voltage signal and a current signal, can achieve the effect of the present invention. The phases, although arranged in the order of the UP, VP, WP, UN, VN, and WN phases in FIG. 17, may be arranged in any order.

Figure 18:
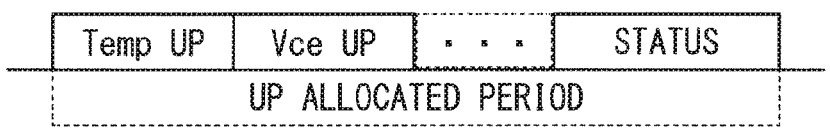
FIG. 18 is a diagram illustrating an UP-phase allocated period divided into multiple sections between which different kinds of data are transmitted.

In FIG. 16, the temperature data undergoes PWM modulation using all the periods allocated to the individual phases. The period allocated to each phase may be further divided into multiple sections between which different kinds of data are transmitted. FIG. 18 illustrates an UP-phase allocated period divided into multiple sections between which temperature data (Temp UP), voltage data (Vce UP), and a detection status are transmitted. That is, the comparator 16 allocates, for modulation, a plurality of kinds of data to allocated periods corresponding to the PWM carrier waves in the individual phases. This enables a single kind of signal in multiple phases to be multiplexed, and also enables different kinds of signal such as a voltage signal and a current signal, to be multiplexed and to be simultaneously transmitted via a single signal line.

It is noted that an analog signal is multiplexed through PWM, and that a digital signal is multiplexed by sending H and L logic signals.

While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS

11 DC-DC converter, 12 secondary-wire-voltage detection circuit, 13 synchronization-signal generation circuit, 14 temperature detection circuit, 15 carrier-wave oscillator, 16 comparator, 17 photocoupler, 18 CR demodulator, 19 delay circuit.

The invention claimed is:
1. An intelligent power module comprising:
 a DC-DC converter comprising a multi-phase arm comprising a plurality of phase arms connected in parallel on a secondary side;
 a secondary-wire-voltage detection circuit configured to detect a secondary wire voltage in each phase arm of the DC-DC converter;
 a synchronization-signal generation circuit configured to generate a synchronization signal in each phase arm on the basis of behavior of the secondary wire voltage;
 a temperature detection circuit configured to detect a temperature in each phase arm and obtain the temperature as temperature data;
 a PWM modulation circuit configured to modulate the temperature data through PWM; and
 a photocoupler configured to transmit the temperature data that has undergone PWM modulation to a primary side of the DC-DC converter, wherein
 the PWM modulation circuit is configured to perform PWM modulation using a PWM carrier wave that is synchronous with the synchronization signal.
2. The intelligent power module according to claim 1, wherein the PWM carrier wave is a sawtooth wave.
3. The intelligent power module according to claim 1, wherein the PWM carrier wave is a triangular wave.
4. The intelligent power module according to claim 1, wherein the PWM modulation circuit is capable of controlling a tilt of the PWM carrier wave.

5. The intelligent power module according to claim 1, wherein the PWM modulation circuit is configured to add, for PWM modulation, an offset to the temperature data detected by the temperature detection circuit.

6. The intelligent power module according to claim 1, wherein the PWM modulation circuit is configured to shift start timing of the PWM carrier wave for each phase.

7. The intelligent power module according to claim 6, wherein the PWM modulation circuit is configured to allocate, for modulation, a plurality of kinds of data to allocated periods corresponding to the PWM carrier wave in each phase.

\* \* \* \* \*